(12) United States Patent
Bin

(10) Patent No.: US 7,135,868 B1
(45) Date of Patent: Nov. 14, 2006

(54) METHOD AND APPARATUS FOR TESTING GATE OXIDE WITH FUSE

(75) Inventor: Gong Bin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/339,310

(22) Filed: Jan. 24, 2006

(30) Foreign Application Priority Data

Nov. 2, 2005 (CN) .................. 2005 1 0110070

(51) Int. Cl.
*H01H 31/12* (2006.01)
(52) U.S. Cl. ...................... 324/551; 324/550
(58) Field of Classification Search ............... 324/551, 324/550
See application file for complete search history.

(56) References Cited

U.S. PATENT DOCUMENTS

| | | | | |
|---|---|---|---|---|
| 4,567,428 A | * | 1/1986 | Zbinden | 374/142 |
| 6,781,401 B1 | * | 8/2004 | Kim | 324/769 |
| 7,053,644 B1 | * | 5/2006 | Lindsey et al. | 324/761 |
| 2005/0212547 A1 | * | 9/2005 | Suzuki | 324/769 |

* cited by examiner

*Primary Examiner*—Walter Benson
(74) *Attorney, Agent, or Firm*—Townsend and Townsend and Crew LLP

(57) ABSTRACT

An apparatus and method for testing a dielectric layer. The apparatus includes a first conductive plate and a second conductive plate. The first conductive plate and the second conductive plate are in direct contact with a dielectric layer. Additionally, the apparatus includes a first conductive wire connected to the first conductive plate and biased to a first predetermined voltage, and a second conductive wire connected to the second conductive plate and a voltage detector. Moreover, the apparatus includes a fuse connected to the second conductive wire, and a third conductive wire connected to the fuse and a device capable of providing a second predetermined voltage and measuring a current.

23 Claims, 4 Drawing Sheets

METHOD AND APPARATUS FOR TESTING GATE OXIDE WITH FUSE

CROSS-REFERENCES TO RELATED APPLICATIONS

This application claims priority to Chinese Patent Application No. 200510110070.3, filed Nov. 2, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides a method and apparatus for testing an oxide layer with fuse. Merely by way of example, the invention has been applied to testing a gate oxide layer. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is testing of a gate oxide layer. FIG. 1 is a simplified diagram showing conventional method and apparatus for testing gate oxide layer. The tested gate oxide layer is sandwiched between two conductive plates 110 and 112. The plate 110 is biased to a ground voltage level by a metal wire 120. The plate 112 is coupled to a source-measure unit (SMU) 130 via a metal wire 122. The source-measure unit 130 can provide a predetermined voltage and measure the resulting current by a probe card 132. During test, a predetermined voltage is provided to the conductive wire 122 by the source-measure unit 130. The resulting current that flows through the conductive wire 122 is measured by the source-measure unit 130. Based on the measured current, whether the gate oxide layer has broken down is determined. If the measured current becomes much higher, the gate oxide layer is determined to have broken down. If the gate oxide layer is determined to have not broken down, another voltage is provided to the conductive wire 122 for further testing. But this conventional method and apparatus for breakdown detection has limited reliability and sensitivity.

From the above, it is seen that an improved technique for testing oxide layer is desired.

BRIEF SUMMARY OF THE INVENTION

The present invention is directed to integrated circuits. More particularly, the invention provides a method and apparatus for testing an oxide layer with fuse. Merely by way of example, the invention has been applied to testing a gate oxide layer. But it would be recognized that the invention has a much broader range of applicability.

In a specific embodiment, the invention provides an apparatus for testing a dielectric layer. The apparatus includes a first conductive plate and a second conductive plate. The first conductive plate and the second conductive plate are in direct contact with a dielectric layer. Additionally, the apparatus includes a first conductive wire connected to the first conductive plate and biased to a first predetermined voltage, and a second conductive wire connected to the second conductive plate and a voltage detector. Moreover, the apparatus includes a fuse connected to the second conductive wire, and a third conductive wire connected to the fuse and a device capable of providing a second predetermined voltage and measuring a current. The fuse can become disconnected if a first current flowing through the fuse reaches or exceeds a first current threshold, and the third conductive wire can become disconnected if a second current flowing through the third conductive wire reaches or exceeds a second current threshold. The first current threshold is lower than the second current threshold in magnitude.

In another embodiment, an apparatus for testing a dielectric layer includes a first conductive plate and a second conductive plate. The first conductive plate and the second conductive plate are in direct contact with a dielectric layer. Additionally, the apparatus includes a first conductive wire connected to the first conductive plate and biased to a first predetermined voltage, and a second conductive wire connected to the second conductive plate and a voltage detector. The voltage detector is capable of measuring a voltage associated with the second conductive wire. Moreover, the apparatus includes a fuse connected to the second conductive wire, and a third conductive wire connected to the fuse and a device capable of providing a second predetermined voltage and measuring a current. The fuse can become disconnected if a first current flowing through the fuse reaches or exceeds a first current threshold, the second conductive wire can become disconnected if a second current flowing through the second conductive wire reaches or exceeds a second current threshold, and the third conductive wire can become disconnected if a third current flowing through the third conductive wire reaches or exceeds a third current threshold. The first current threshold is lower than the second current threshold in magnitude, and the first current threshold is lower than the third current threshold in magnitude.

In yet another embodiment, a method for testing a dielectric layer includes placing a dielectric layer between a first conductive plate and a second conductive plate. The first conductive plate and the second conductive plate are in direct contact with the dielectric layer. Additionally, the method includes providing a first predetermined voltage by a device to a first conductive wire. The first conductive wire is connected to a fuse. Moreover, the method includes measuring by the device a first current associated with the first conductive wire, and measuring by a voltage detector a voltage associated with a second conductive wire. The second conductive wire is connected to the second conductive plate and the fuse. Also, the method includes processing information associated with the measured first current and the measured voltage, and determining whether the dielectric layer has broken down based on at least information associated with the measured first current and the measured voltage.

Many benefits are achieved by way of the present invention over conventional techniques. Some embodiments of the present invention provide a testing mechanism that avoids or reduces damage to a probe card. Certain embodiments of the present invention can improve detection sensitivity for dielectric breakdown. Some embodiments of the present invention can improve detection reliability for dielectric breakdown. Certain embodiments of the present invention provide fast detection by using two source-measure units. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a method and apparatus for testing an oxide layer with fuse. Merely by way of example, the invention has been applied to testing a gate oxide layer. But it would be recognized that the invention has a much broader range of applicability.

Figure 1:
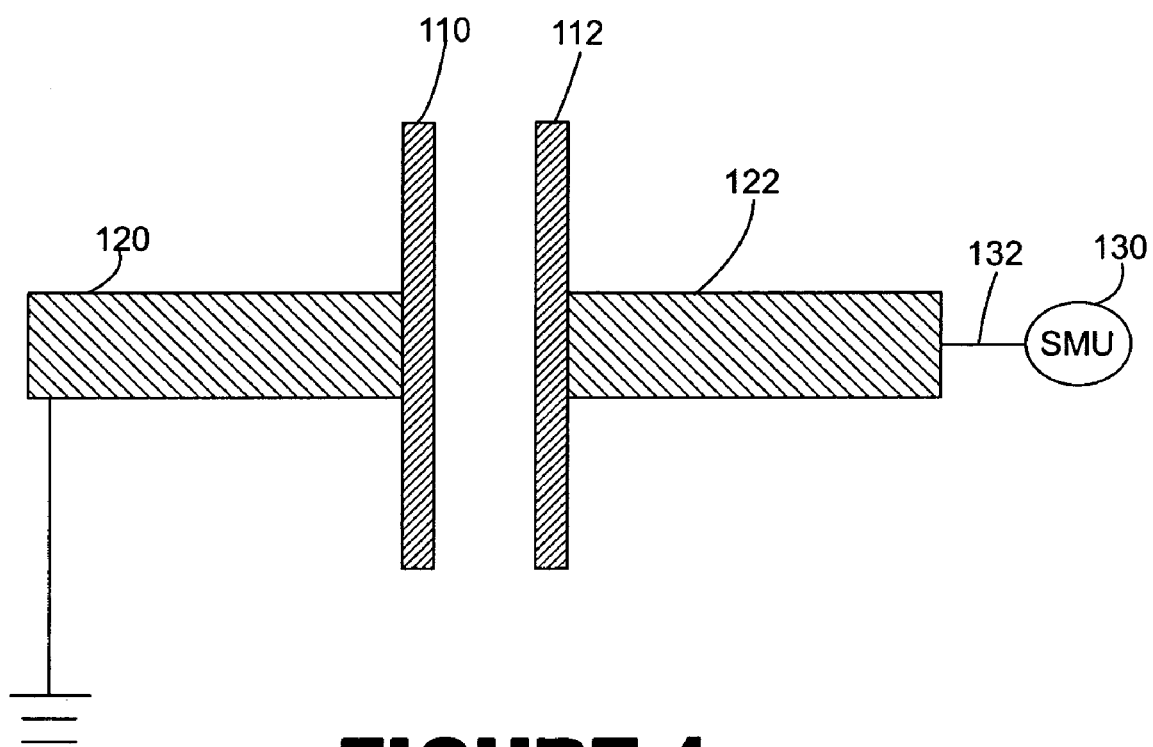
FIG. 1 is a simplified diagram showing conventional method and apparatus for testing gate oxide layer.

As discussed above, in FIG. 1, when the gate oxide layer breaks down, the current flowing through the wire 122 should become much higher. The high current can burn out the metal wire 122, and/or damage the probe card 132. If the metal wire 122 is burned out, the metal wire 122 becomes disconnected and the current flowing through the metal wire 122 decrease quickly. Hence the breakdown of the gate oxide layer can become difficult to detect.

Figure 2:
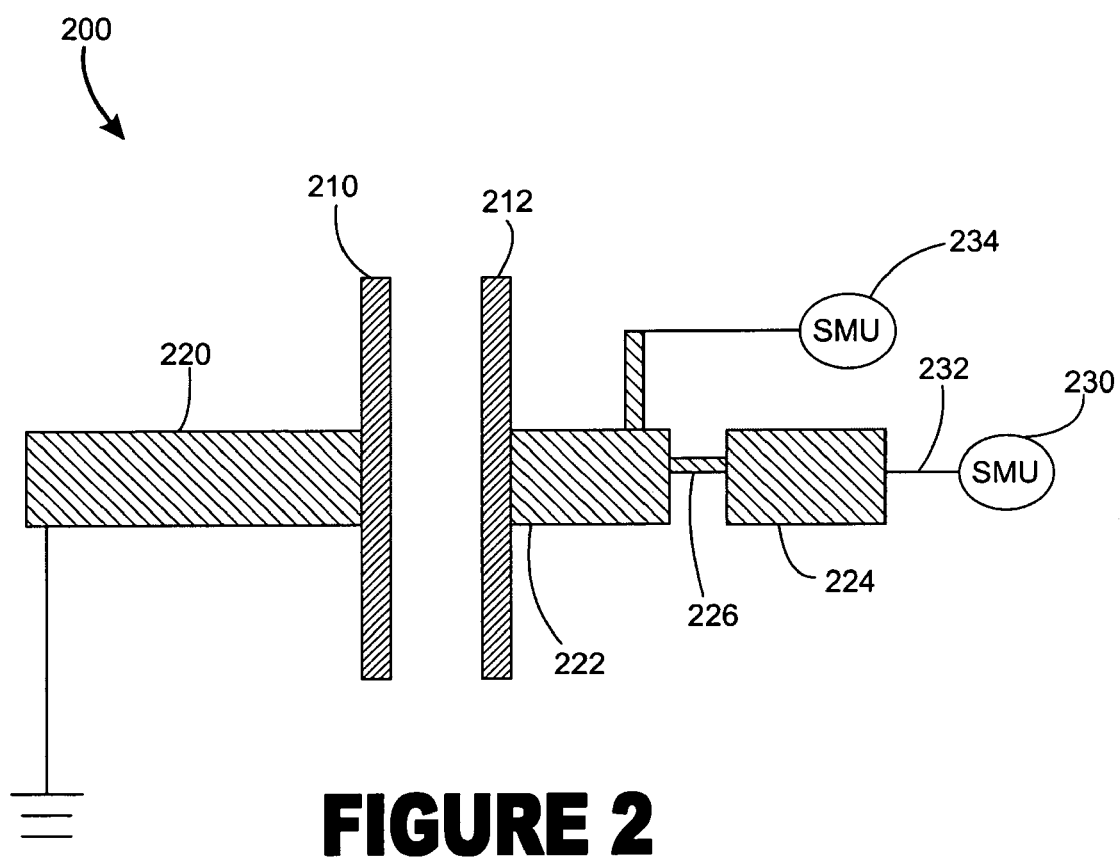
FIG. 2 is a simplified apparatus for testing gate oxide layer according to an embodiment of the present invention.

FIG. 2 is a simplified apparatus for testing gate oxide layer according to an embodiment of the present invention. This diagram is merely an example, which should not unduly limit the scope of the claims. One of ordinary skill in the art would recognize many variations, alternatives, and modifications. The apparatus 200 includes the following components:

1. Conductive plates 210 and 212;
2. Conductive wires 220, 222 and 224;
3. Fuse 226;
4. Source-Measure Units 230 and 234.

Although the above has been shown using a selected group of components for the apparatus 200, there can be many alternatives, modifications, and variations. For example, some of the components may be expanded and/or combined. Other components may be inserted to those noted above. Depending upon the embodiment, the arrangement of components may be interchanged with others replaced. For example, the source-measure unit 234 is replaced by a voltage detector. In another example, the source-measure unit 230 is replaced by a device capable of providing a predetermined voltage and measuring a resulting current. Further details of these components are found throughout the present specification and more particularly below.

A tested gate oxide layer is switched between the two conductive plates 210 and 212. For example, the conductive plates 210 and 212 are made of metal. The conductive plate 210 is biased to a ground voltage level by the conductive wire 220. The conductive plate 212 is connected to the conductive wire 222. The conductive wire 222 is linked to the conductive wire 224 by the fuse 226. For example, the conductive wires 222 and 224 are made of metal and/or polysilicon. In another example, the fuse 226 is made of metal and/or polysilicon. In yet another example, the fuse 226 is thinner than the conductive wires 222 and 224. In yet another example, the fuse 226 should be burned out at a threshold current that is lower than another threshold current for the conductive wires 222 and 224 to get burned out. The conductive wire 224 is coupled to the source-measure unit 230, and the conductive wire 222 is coupled to the source-measure unit 234.

Figure 3:
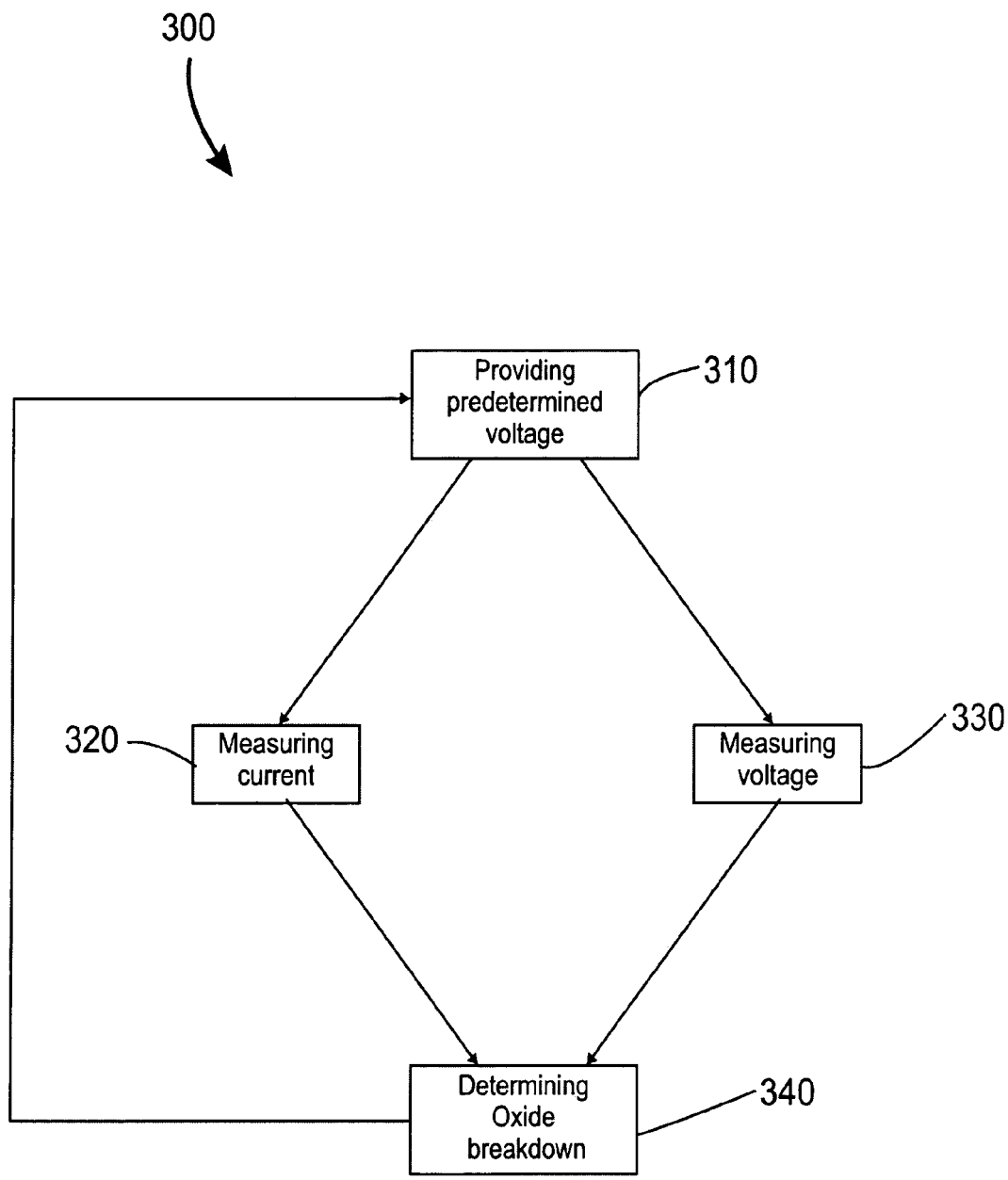
FIG. 3 is a simplified method for testing gate oxide layer according to an embodiment of the present invention.

FIG. 3 is a simplified method for testing gate oxide layer according to an embodiment of the present invention. This diagram is merely an example, which should not unduly limit the scope of the claims. One of ordinary skill in the art would recognize many variations, alternatives, and modifications. The method 300 includes the following processes:

1. Process 310 for providing predetermined voltage;
2. Process 320 for measuring current;
3. Process 330 for measuring voltage;
4. Process 340 for determining oxide breakdown.

Although the above has been shown using a selected group of processes for the method 300, there can be many alternatives, modifications, and variations. For example, some of the processes may be expanded and/or combined. Other processes may be inserted to those noted above. For example, placing a gate oxide layer between the conductive plates 210 and 212 is performed prior to the process 310. In another example, the method 300 is performed by the apparatus 200. Depending upon the embodiment, the arrangement of processes may be interchanged with others replaced. For example, at least part of the process 320 and at least part of the process 330 are performed at the same time. In another example, the process 320 is performed before or after the process 330. Further details of these processes are found throughout the present specification and more particularly below.

At the process 310, a predetermined voltage is provided to the conductive wire 224 by the source-measure unit 230. At the process 320, a current flowing through the conductive wire 224 is measured by the source-measure unit 230. At the process 330, a voltage level related to the conductive wire 222 is measured by the source-measure unit 234.

At the process 340, whether a gate oxide layer has broken down is determined. If the current measured at the process 320 increases from substantially zero and reaches or exceeds a current threshold, the gate oxide layer is determined to have broken down. If the voltage measured at the process 330 becomes substantially different from the voltage provided at the process 310, the gate oxide layer is determined to have broken down. For example, the measured voltage drops to substantially zero even though the supplied voltage increases or remains unchanged. If the gate oxide layer is determined to have not broken down, the process 310 is again performed. For example, a different voltage is supplied to the conductive wire 224.

In one embodiment, if the current measured at the process 320 increases from substantially zero and reaches or exceeds the current threshold, the fuse 226 is not yet burned out. The current increase is determined to have resulted from the oxide breakdown. In another embodiment, if the voltage measured at the process 330 becomes substantially different from the voltage provided at the process 310, the fuse 226 has been burned out as a result of a high current flowing through the fuse 226. This high current comes from the oxide breakdown. After the fuse 226 is burned out, the current flowing through the fuse 226 would become much smaller, such as equal to substantially zero.

Figure 4:
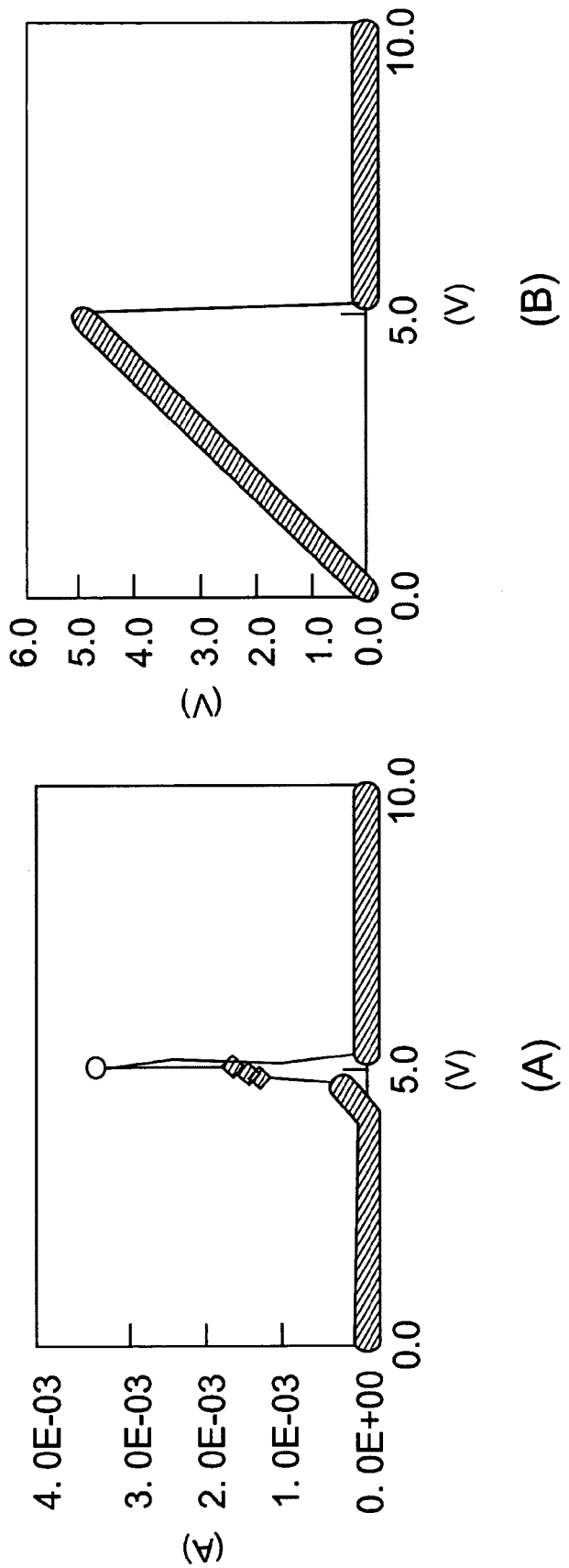
FIGS. 4(A) and (B) are simplified diagrams showing measured current and voltage according to an embodiment of the present invention.

FIGS. 4(A) and (B) are simplified diagrams showing measured current and voltage according to an embodiment of the present invention. These diagrams are merely examples, which should not unduly limit the scope of the claims. One of ordinary skill in the art would recognize many variations, alternatives, and modifications.

In FIGS. 4(A) and (B), the horizontal axes represent the voltage provided at the process 310. The vertical axis in FIG. 4(A) represents the current measured at the process 320, and the vertical axis in FIG. 4(B) represents the voltage measured at the process 330. As shown in FIG. 4(A), the measured current jumps from substantially zero to about 3.345 mA, and then drops back to substantially zero. In contrast, as shown in FIG. 4(B), the measured voltage remains substantially equal to the provided voltage, and then drops to substantially zero. The measured current dropping back to substantially zero and the measured voltage dropping to substantially zero should occur at about the same time when the fuse is getting burned out.

In another embodiment, an apparatus for testing a dielectric layer includes a first conductive plate and a second conductive plate. The first conductive plate and the second conductive plate are in direct contact with a dielectric layer. Additionally, the apparatus includes a first conductive wire connected to the first conductive plate and biased to a first predetermined voltage, and a second conductive wire connected to the second conductive plate and a voltage detector. Moreover, the apparatus includes a fuse connected to the second conductive wire, and a third conductive wire connected to the fuse and a device capable of providing a second predetermined voltage and measuring a current. The fuse can become disconnected if a first current flowing through the fuse reaches or exceeds a first current threshold, and the third conductive wire can become disconnected if a second current flowing through the third conductive wire reaches or exceeds a second current threshold. The first current threshold is lower than the second current threshold in magnitude. For example, the apparatus is implemented according to the apparatus 200.

In yet another embodiment, an apparatus for testing a dielectric layer includes a first conductive plate and a second conductive plate. The first conductive plate and the second conductive plate are in direct contact with a dielectric layer. Additionally, the apparatus includes a first conductive wire connected to the first conductive plate and biased to a first predetermined voltage, and a second conductive wire connected to the second conductive plate and a voltage detector. The voltage detector is capable of measuring a voltage associated with the second conductive wire. Moreover, the apparatus includes a fuse connected to the second conductive wire, and a third conductive wire connected to the fuse and a device capable of providing a second predetermined voltage and measuring a current. The fuse can become disconnected if a first current flowing through the fuse reaches or exceeds a first current threshold, the second conductive wire can become disconnected if a second current flowing through the second conductive wire reaches or exceeds a second current threshold, and the third conductive wire can become disconnected if a third current flowing through the third conductive wire reaches or exceeds a third current threshold. The first current threshold is lower than the second current threshold in magnitude, and the first current threshold is lower than the third current threshold in magnitude. For example, the apparatus is implemented according to the apparatus 200.

In yet another embodiment, a method for testing a dielectric layer includes placing a dielectric layer between a first conductive plate and a second conductive plate. The first conductive plate and the second conductive plate are in direct contact with the dielectric layer. Additionally, the method includes providing a first predetermined voltage by a device to a first conductive wire. The first conductive wire is connected to a fuse. Moreover, the method includes measuring by the device a first current associated with the first conductive wire, and measuring by a voltage detector a voltage associated with a second conductive wire. The second conductive wire is connected to the second conductive plate and the fuse. Also, the method includes processing information associated with the measured first current and the measured voltage, and determining whether the dielectric layer has broken down based on at least information associated with the measured first current and the measured voltage. For example, the method is implemented according to the method 300.

In another example, the determining whether the dielectric layer has broken down includes if the measured voltage is substantially different from the predetermined voltage and the measured first current is substantially equal to zero, determining the dielectric layer to have broken down. In yet another example, the determining whether the dielectric layer has broken down includes determining whether the fuse has become open based on at least information associated with the measured first current and the measured voltage. If the fuse is determined to have become open, determining the dielectric layer to have broken down.

In yet another example, the method includes if the dielectric layer is determined to have not broken down, providing a second predetermined voltage by the device to the first conductive wire, measuring by the device the first current associated with the first conductive wire, measuring by the voltage detector the voltage associated with the second conductive wire, processing information associated with the measured first current and the measured voltage, and determining whether the dielectric layer has broken down based on at least information associated with the measured first current and the measured voltage. In yet another example, the method includes if the dielectric layer is determined to have broken down, determining a breakdown voltage for the dielectric layer to be equal to the first predetermined voltage subtracted by a second predetermined voltage. The first conductive plate is biased to the second predetermined voltage.

The present invention has various applications. In one embodiment, the apparatus 200 and the method 300 are used to test an oxide layer other than a gate oxide layer. In another embodiment, the apparatus 200 and the method 300 is used to test a dielectric layer other than a gate oxide layer. In yet anther embodiment, the apparatus 200 and the method 300 are used to test breakdown of a structure other than a gate oxide layer. For example, the apparatus 200 and the method 300 are used to test breakdown of a PN junction. In another example, the apparatus 200 and the method 300 are used to test breakdown of an inter layer dielectric (ILD) structure and/or an inter metal dielectric (IMD) structure. In yet another example, the apparatus 200 and the method 300 are used to test breakdown of a poly insulator poly (PIP) capacitor and/or a metal insulator metal (MIM) capacitor.

The present invention has various advantages. Some embodiments of the present invention provide a testing mechanism that avoids or reduces damage to a probe card. Certain embodiments of the present invention can improve detection sensitivity for dielectric breakdown. Some embodiments of the present invention can improve detection reliability for dielectric breakdown. Certain embodiments of the present invention provide fast detection by using two source-measure units.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for testing a dielectric layer, the apparatus comprising:
   a first conductive plate;
   a second conductive plate, the first conductive plate and the second conductive plate being in direct contact with a dielectric layer;
   a first conductive wire connected to the first conductive plate and biased to a first predetermined voltage;
   a second conductive wire connected to the second conductive plate and a voltage detector;
   a fuse connected to the second conductive wire;
   a third conductive wire connected to the fuse and a device capable of providing a second predetermined voltage and measuring a current;
   wherein:
      the fuse can become disconnected if a first current flowing through the fuse reaches or exceeds a first current threshold;
      the third conductive wire can become disconnected if a second current flowing through the third conductive wire reaches or exceeds a second current threshold;
      the first current threshold is lower than the second current threshold in magnitude.

2. The apparatus of claim 1 wherein:
   the second conductive wire can become disconnected if a third current flowing through the second conductive wire reaches or exceeds a third current threshold;
   the first current threshold is lower than the third current threshold in magnitude.

3. The apparatus of claim 1 wherein the voltage detector is capable of measuring a voltage associated with the second conductive wire.

4. The apparatus of claim 1 wherein the voltage detector is a source-measure unit.

5. The apparatus of claim 1 wherein the device is a source-measure unit.

6. The apparatus of claim 1 wherein the first predetermined voltage is a ground voltage.

7. The apparatus of claim 1 wherein the fuse comprises at least one selected from a group consisting of metal and polysilicon.

8. The apparatus of claim 1 wherein the dielectric layer is an oxide layer.

9. An apparatus for testing a dielectric layer, the apparatus comprising:
   a first conductive plate;
   a second conductive plate, the first conductive plate and the second conductive plate being in direct contact with a dielectric layer;
   a first conductive wire connected to the first conductive plate and biased to a first predetermined voltage;
   a second conductive wire connected to the second conductive plate and a voltage detector, the voltage detector capable of measuring a voltage associated with the second conductive wire;
   a fuse connected to the second conductive wire;
   a third conductive wire connected to the fuse and a device capable of providing a second predetermined voltage and measuring a current;
   wherein:
      the fuse can become disconnected if a first current flowing through the fuse reaches or exceeds a first current threshold;
      the second conductive wire can become disconnected if a second current flowing through the second conductive wire reaches or exceeds a second current threshold;
      the third conductive wire can become disconnected if a third current flowing through the third conductive wire reaches or exceeds a third current threshold;
      the first current threshold is lower than the second current threshold in magnitude;
      the first current threshold is lower than the third current threshold in magnitude.

10. The apparatus of claim 9 wherein the voltage detector is a source-measure unit.

11. The apparatus of claim 9 wherein the device is a source-measure unit.

12. The apparatus of claim 9 wherein the first predetermined voltage is a ground voltage.

13. The apparatus of claim 9 wherein the fuse comprises at least one selected from a group consisting of metal and polysilicon.

14. The apparatus of claim 9 wherein the dielectric layer is an oxide layer.

15. A method for testing a dielectric layer, the method comprising:
   placing a dielectric layer between a first conductive plate and a second conductive plate, the first conductive plate and the second conductive plate being in direct contact with the dielectric layer;
   providing a first predetermined voltage by a device to a first conductive wire, the first conductive wire being connected to a fuse;
   measuring by the device a first current associated with the first conductive wire;

measuring by a voltage detector a voltage associated with a second conductive wire, the second conductive wire being connected to the second conductive plate and the fuse;

processing information associated with the measured first current and the measured voltage;

determining whether the dielectric layer has broken down based on at least information associated with the measured first current and the measured voltage.

16. The method of claim 15 wherein the determining whether the dielectric layer has broken down comprises if the measured first current reaches or exceeds a first current threshold, determining the dielectric layer to have broken down.

17. The method of claim 15 wherein the determining whether the dielectric layer has broken down comprises if the measured voltage is substantially different from the predetermined voltage, determining the dielectric layer to have broken down.

18. The method of claim 15 wherein the determining whether the dielectric layer has broken down comprises if the measured voltage is substantially different from the predetermined voltage and the measured first current is substantially equal to zero, determining the dielectric layer to have broken down.

19. The method of claim 15 wherein the determining whether the dielectric layer has broken down comprises:

determining whether the fuse has become open based on at least information associated with the measured first current and the measured voltage;

if the fuse is determined to have become open, determining the dielectric layer to have broken down.

20. The method of claim 15 wherein:

the first conductive wire can become disconnected if the first current reaches or exceeds a first current threshold;

the fuse can become disconnected if a second current flowing through the fuse reaches or exceeds a second current threshold;

the first current threshold is higher than the second current threshold in magnitude.

21. The method of claim 15 wherein the dielectric layer is an oxide layer.

22. The method of claim 15, and further comprising:

if the dielectric layer is determined to have not broken down, providing a second predetermined voltage by the device to the first conductive wire;

measuring by the device the first current associated with the first conductive wire;

measuring by the voltage detector the voltage associated with the second conductive wire;

processing information associated with the measured first current and the measured voltage;

determining whether the dielectric layer has broken down based on at least information associated with the measured first current and the measured voltage.

23. The method of claim 15, and further comprising if the dielectric layer is determined to have broken down, determining a breakdown voltage for the dielectric layer to be equal to the first predetermined voltage subtracted by a second predetermined voltage, the first conductive plate being biased to the second predetermined voltage.

* * * * *